US012660143B2

(12) United States Patent
Twiss

(10) Patent No.: US 12,660,143 B2
(45) Date of Patent: Jun. 16, 2026

(54) SELF-EQUALIZING FRAME FOR THERMAL MANAGEMENT DEVICE PRELOAD

(71) Applicant: Cisco Technology, Inc., San Jose, CA (US)

(72) Inventor: Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 803 days.

(21) Appl. No.: 17/963,486

(22) Filed: Oct. 11, 2022

(65) Prior Publication Data

US 2024/0121932 A1     Apr. 11, 2024

(51) Int. Cl.
H05K 13/04 (2006.01)
H05K 3/303 (2026.01)

(52) U.S. Cl.
CPC ........... H05K 13/046 (2013.01); H05K 3/303 (2013.01); *H05K 2201/066* (2013.01); *H05K 2201/10265* (2013.01); *H05K 2201/10409* (2013.01); *H05K 2201/10598* (2013.01); *H05K 2203/0278* (2013.01)

(58) Field of Classification Search
CPC ................. H05K 13/046; H05K 3/303; H05K 2201/066; H05K 2201/10265; H05K 2201/10598; H05K 2203/0278
See application file for complete search history.

(56) References Cited

U.S. PATENT DOCUMENTS

| | | | | |
|---|---|---|---|---|
| 4,899,920 A | * | 2/1990 | Abbagnaro | ........ H05K 13/0409 |
| | | | | 392/492 |
| 5,290,134 A | * | 3/1994 | Baba | .................. G01R 31/2893 |
| | | | | 414/754 |
| 6,137,298 A | * | 10/2000 | Binns | ................. G01R 31/2886 |
| | | | | 324/750.02 |
| 6,141,866 A | * | 11/2000 | Heater | ................ H01L 21/4882 |
| | | | | 29/713 |

(Continued)

FOREIGN PATENT DOCUMENTS

| | | | | | |
|---|---|---|---|---|---|
| CN | | 112970104 A | * | 6/2021 | ............. H01L 23/40 |
| EP | | 4247126 A1 | * | 9/2023 | ......... H01L 23/4006 |

(Continued)

OTHER PUBLICATIONS

Translation of CN-112970104-A (Year: 2021).*

(Continued)

*Primary Examiner* — Jeffrey T Carley
(74) *Attorney, Agent, or Firm* — Edell, Shapiro & Finnan, LLC

(57) ABSTRACT

Apparatuses, systems, and methods for a controlled-force thermal management device installation that helps thermal management of emerging, next-generation devices are provided. An apparatus includes at least two compression interfaces, each for compressing a mounting assembly of a thermal management device to a predetermined loading point. The apparatus further includes a frame configured to apply a preload force to the at least two compression interfaces. The frame has a pivoting joint at an assembly (Continued)

point for each of the at least two compression interfaces to balance the preload force between the at least two compression interfaces.

14 Claims, 10 Drawing Sheets

(56) References Cited

U.S. PATENT DOCUMENTS

| | | | |
|---|---|---|---|
| 6,881,088 B2 * | 4/2005 | Gattuso | G01R 1/0466 |
| | | | 324/750.05 |
| 11,071,195 B1 | 7/2021 | Tong | |
| 12,501,585 B2 * | 12/2025 | Twiss | H05K 7/20418 |
| 2004/0088853 A1 * | 5/2004 | Cromwell | H01L 23/4006 |
| | | | 257/E23.084 |
| 2006/0215383 A1 | 9/2006 | Unrein | |
| 2006/0238990 A1 * | 10/2006 | Suhir | H01L 23/4006 |
| | | | 361/813 |
| 2007/0035937 A1 | 2/2007 | Colbert et al. | |
| 2007/0241449 A1 | 10/2007 | Colbert et al. | |
| 2008/0264603 A1 | 10/2008 | Colbert et al. | |
| 2008/0266808 A1 | 10/2008 | Aberg et al. | |
| 2009/0083972 A1 | 4/2009 | Colbert et al. | |
| 2009/0300903 A1 * | 12/2009 | Yang | H01L 21/67121 |
| | | | 29/726 |
| 2021/0183738 A1 * | 6/2021 | Tong | H01L 23/4006 |
| 2023/0129211 A1 * | 4/2023 | Twiss | H05K 13/0882 |
| | | | 361/709 |

FOREIGN PATENT DOCUMENTS

| | | | |
|---|---|---|---|
| WO | 2005124931 A1 | 12/2005 | |
| WO | WO-2017202254 A1 * | 11/2017 | G06F 1/20 |

OTHER PUBLICATIONS

Translation of WO-2017202254-A1 (Year: 2017).*

Kryotherm, "Thermoelectric Generating Modules," https://www. amstechnologies-webshop.com/media/pdf/0b/be/d0/Thermoelectric-Peltier-Generator-Modules-Kryotherm-Overview.pdf, Apr. 2019, 4 pages.

* cited by examiner

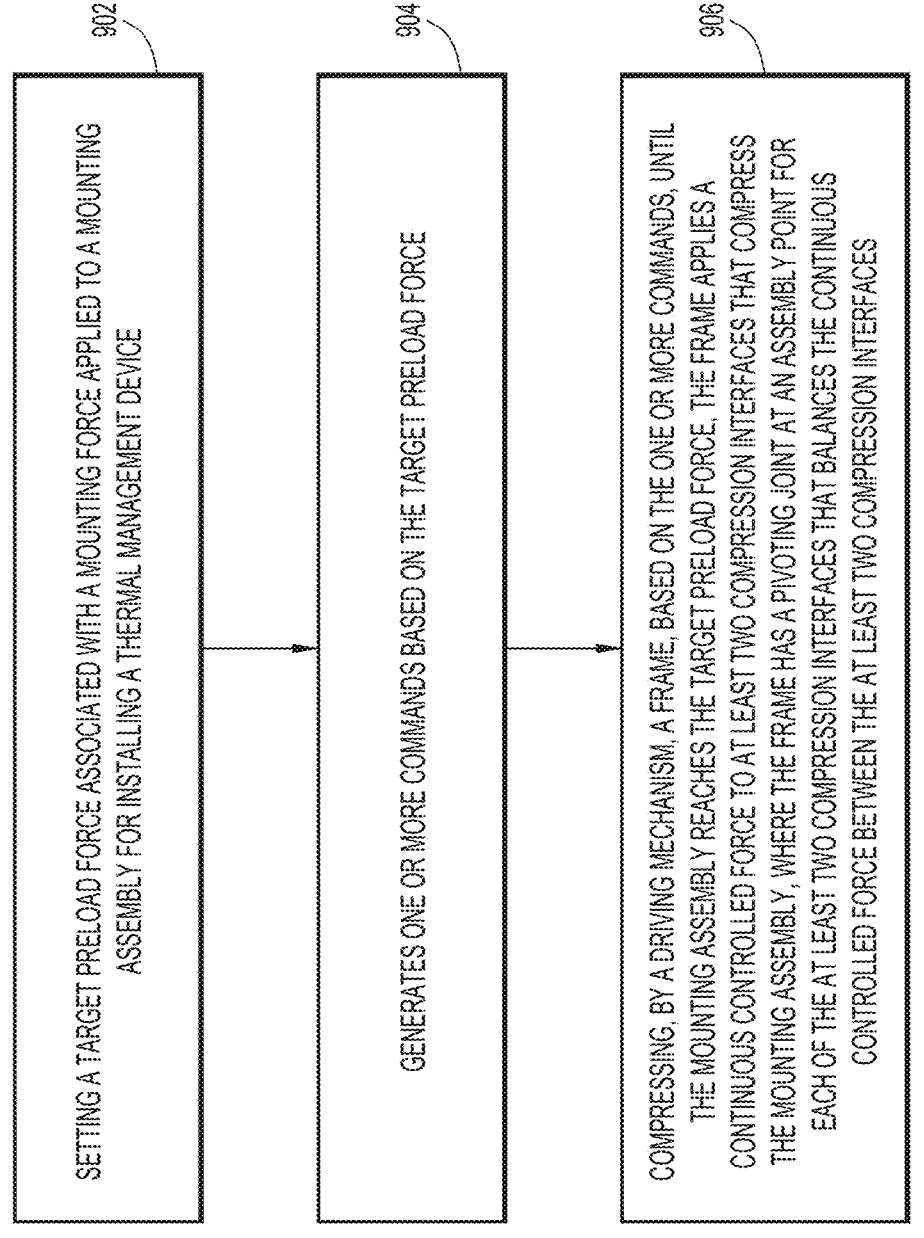

902

SETTING A TARGET PRELOAD FORCE ASSOCIATED WITH A MOUNTING FORCE APPLIED TO A MOUNTING ASSEMBLY FOR INSTALLING A THERMAL MANAGEMENT DEVICE

904

GENERATES ONE OR MORE COMMANDS BASED ON THE TARGET PRELOAD FORCE

906

COMPRESSING, BY A DRIVING MECHANISM, A FRAME, BASED ON THE ONE OR MORE COMMANDS, UNTIL THE MOUNTING ASSEMBLY REACHES THE TARGET PRELOAD FORCE, THE FRAME APPLIES A CONTINUOUS CONTROLLED FORCE TO AT LEAST TWO COMPRESSION INTERFACES THAT COMPRESS THE MOUNTING ASSEMBLY, WHERE THE FRAME HAS A PIVOTING JOINT AT AN ASSEMBLY POINT FOR EACH OF THE AT LEAST TWO COMPRESSION INTERFACES THAT BALANCES THE CONTINUOUS CONTROLLED FORCE BETWEEN THE AT LEAST TWO COMPRESSION INTERFACES

SELF-EQUALIZING FRAME FOR THERMAL MANAGEMENT DEVICE PRELOAD

TECHNICAL FIELD

The present disclosure relates to a thermal management device installation, such as for a heatsink, and in particular, an apparatus, system, and method for mounting a thermal management device onto a device.

BACKGROUND

Market demands for features and equipment bandwidth are driving system power requirements higher and higher. Thus, new and innovative measures to manage the thermal energy produced by system componentry, primarily ASIC devices, are required. A variety of thermal management devices (TMDs) including heatsinks, heat pipes, thermal siphons, and liquid-cooling combinations are employed to remove, redirect, and dispose of increasing thermal energy loads. Additionally, various thermal interface materials (TIMs) are being developed to help "gap fill" and reduce thermal impedance between silicon devices and TMD components.

BRIEF DESCRIPTION OF THE DRAWINGS

FIG. 9 is a flow chart of a method of preloading mounting assemblies for installing the TMD, according to an example embodiment.

DETAILED DESCRIPTION

Overview

Figure 1:
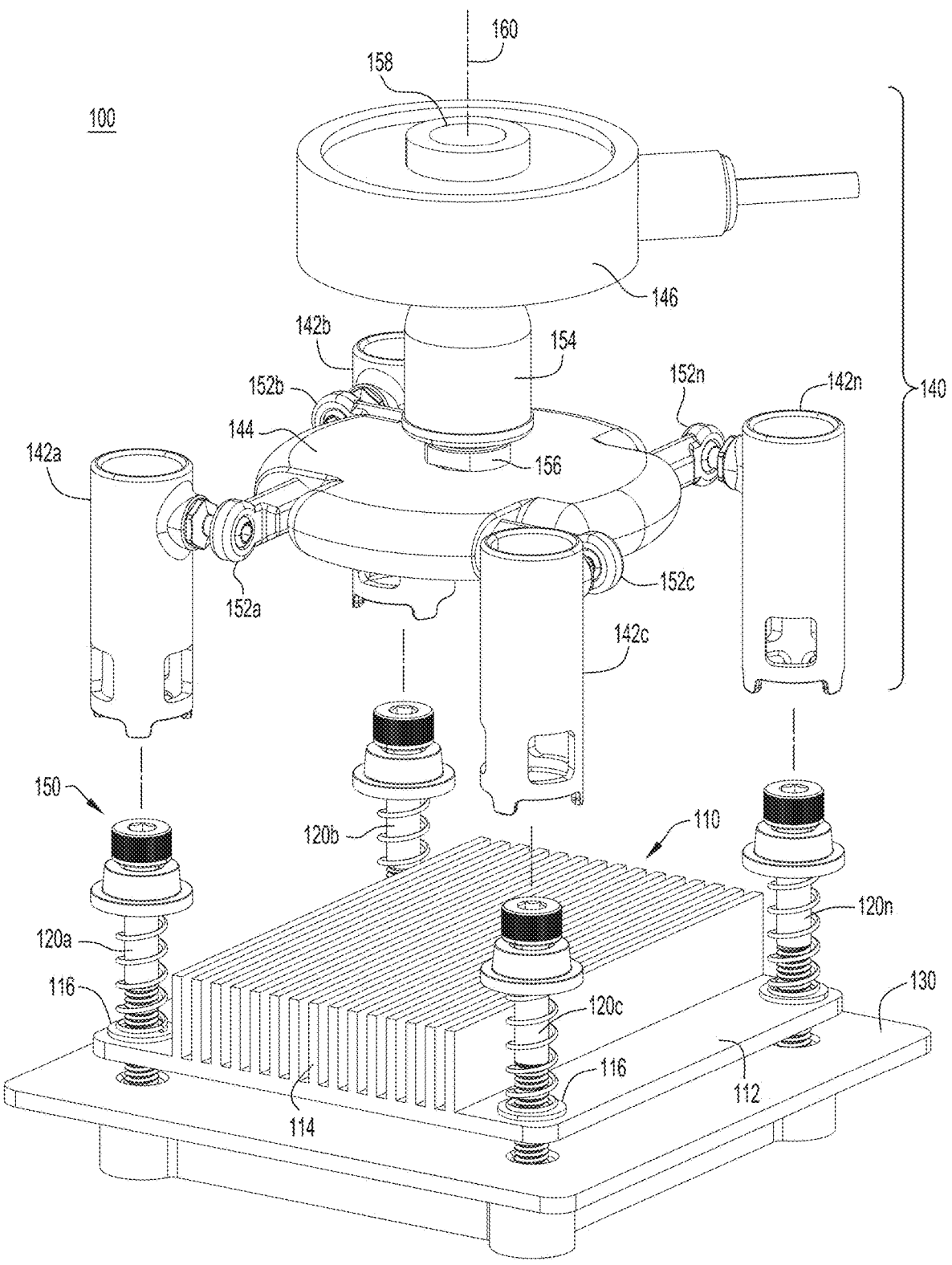
FIG. 1 is a side perspective view of a system having a self-equalizing TMD preload frame assembly for installing a thermal management device (TMD) onto a printed circuit board (PCB) using mounting assemblies, according to an example embodiment.

Presented herein are apparatuses, systems, and methods for controlled-force TMD installation with equalized preload force at each mounting point that helps thermal management of emerging, next-generation devices. In addition, the apparatuses, systems, and methods provide a future-proof platform that is readily programmable and adaptable to a wide-range of system architectures and specific applications.

In one form, an apparatus for balancing a preload force at each assembly point is provided. The apparatus includes at least two compression interfaces. Each compression interface is for compressing a mounting assembly of a thermal management device to a predetermined loading point. The apparatus further includes a frame configured to apply a preload force to the at least two compression interfaces. The frame has a pivoting joint at an assembly point for each of the at least two compression interfaces to balance the preload force between the at least two compression interfaces.

In another form, a system for preloading a mounting assembly during installation of a thermal management device is provided. The system includes a programmable controller configured to generate one or more commands to control an installation of a thermal management device using a mounting assembly. The system further includes at least two compression interfaces. Each compression interface compresses the mounting assembly to a predetermined loading point. The system further includes a frame that applies a preload force to the at least two compression interfaces. The frame has a pivoting joint at an assembly point for each of the at least two compression interfaces to balance the pre-load force between the at least two compression interfaces. The system further includes a driving mechanism configured to drive the frame until the mounting assembly reaches the predetermined loading point, based on the one or more commands.

In yet another form, a method of preloading a mounting assembly during installation of a thermal management device is provided. The method involves a programmable controller setting a target preload force associated with a mounting force applied to a mounting assembly for installing the thermal management device. The method further involves the programmable controller generating one or more commands, based on the target preload force. The method further involves compressing, by a driving mechanism, a frame, based on the one or more commands, until the mounting assembly reaches the target preload force. The frame applies a continuous controlled force to at least two compression interfaces that compress the mounting assembly. The frame has a pivoting joint at an assembly point for each of the at least two compression interfaces that balances the continuous controlled force between the at least two compression interfaces.

Example Embodiments

Various devices require cooling. For example, network devices, server computer systems, etc., include multiple semiconductor chips. Thermal management devices (TMDs) such as heatsinks are used to dissipate thermal energy generated by these chips. Achieving effective thermal management and reducing thermal impedance between components of the TMD and silicon devices can be challenging.

For example, application specific integrated circuit (ASIC) components are increasing in size and changing in system architecture and structure (such as moving from "lidded" to "lidless" packaging), in part, to improve thermal performance. While the "lidless" designs of silicon device packages decrease overall thermal impedance by removing multiple interfaces within the TMD/TIM "stack", they introduce various challenges, including stringent limitations on overall TMD mounting forces and co-planarity with the silicon devices to be cooled. That is, the TMDs need to be affixed to ASICs with more precise assembly force control than previously required.

Based on different requirements for various types of semiconductor chips, there are different ways in which the heatsinks may be installed, including, for example, the use of thermal epoxies, Z-clips, pushpins, and spring screws. For some chips (e.g., graphical processing unit (GPU) or central processing unit (CPU)), a threaded, spring-loaded fastener is used for a heatsink installation. That is, TMDs are mounted to silicon devices/components using spring-loaded fasteners that screw into the surrounding printed-circuit board (PCB) material and/or rigid mounting plates. Tightening and loosening the mounting screws allows some measure of control over the overall TMD mounting force exerted on the silicon device.

To improve force control, a "preload" force may be applied to the TMD in advance of the final assembly actions. Preload is an effective approach to prevent tipping and skewing of the TMD device during installation. For example, preload may be 80% of the final force to help eliminate tipping, then the remaining 20% of force is applied to complete the assembly process. Assembly actions are typically accomplished by screwing spring-loaded fasteners that apply a compressive load at multiple assembly points on the TMD periphery. While helpful, preloads need to be applied carefully. Preload needs to ensure that the total compressive/preload force is achieved while also accomplishing an equal load balance across the TMD assembly fastener locations/assembly points. For example, unequal loading can potentially crack an ASIC structure, or damage thermal interface materials situated between TMDs and ASIC devices. Such damage can cause immediate device failure or show up later in the device's service.

In manufacturing, simple clamps and point vertical loads are often used to apply the required preload force. These methods supply a repeatable approximate loading force but no precise loading verification (or traceable assembly data collected), nor load balancing are possible. These methods are not sufficiently accurate at least because of high variability in torque wrench setting repeatability. Further, the inferred torque-applied force is confounded, at a minimum, by a combination of both the compression spring force and screw thread friction. Thus, specifying accurate and repeatable preload force is extremely difficult, if not impossible. In addition, it is not possible to independently verify whether a skew between assembly points has occurred during preload, making defect analyses and diagnoses extremely difficult should system performance problems occur post-assembly.

Some assembly techniques involve using a "constant height" fastener reliant on compression springs that are characterized and sorted based on similar spring-rate (i.e., force-deflection) characteristics. That is, individual springs are evaluated for spring-constant performance and then sorted and grouped into "+5%" or "−10%" etc. bins. During assembly, springs are then grouped with other springs from the same "performance family". This is intended to equalize spring forces and thereby, attempts to control TMD tilt and resultant gaps. However, this assembly technique cannot precisely control the preload force. This assembly technique essentially forces precision on a mechanical device that is inherently imprecise.

Poorly controlled or unequal mounting forces may cause gaps between the TMD and silicon components leading to, at best, poor performance, and, at worst, thermal runaway conditions that can destroy the silicon device. In addition, while silicon possesses relatively high compressive strength, it responds poorly to shear and tensile forces, and can become brittle leading to cracking due to unequal mounting and loading forces and excessive co-planarity mismatches. In both cases, the results of poorly controlled TMD mounting forces may not be seen immediately, and only become apparent later as a network problem or an in the field system failure requiring a costly Return Merchandise Authorization (RMA) case.

Techniques presented herein provide for a self-equalizing TMD preload frame assembly that applies an even preload force at each installation/assembly point during installation of the TMD. The techniques ensure precise control of TMD mounting and/or preload forces for any TMD configuration during manufacturing assembly and for validating these forces to improve ongoing manufacturing and product quality control systems. The techniques involve a system, a method, an assembly, and/or an apparatus for preloading the TMDs on silicon components during installation with a balanced, controlled, precise, repeatable, and verifiable preload force.

A frame structure is provided that mechanically applies balanced preload force to mounting assemblies for installing the TMD during manufacturing assembly. Specifically, a fully articulating frame attaches through pivoting joints to compression interfaces that compress individual mounting assemblies to a predetermined loading point. The pivoting joints are provided at each assembly point. The pivoting joints may articulate freely (thus called "articulating joints") or just rotate around the respective compression interface. The articulating frame balances the preload force between these compression interfaces. Various non-limiting example embodiments of these components are described below in further detail.

FIG. 1 is a side perspective view of a system 100 having a self-equalizing TMD preload frame assembly for installing the TMD onto a printed circuit board (PCB) using mounting assemblies, according to an example embodiment. The system 100 is depicted before the self-equalizing TMD preload frame assembly engages with mounting assemblies. The system 100 includes the TMD 110, a plurality of mounting assemblies 120a-n, a printed circuit board (PCB) 130, and a self-equalizing frame assembly 140.

The notations "a-n", "a-k", and the like denote that a number is not limited, can vary widely, and depends on a particular use case scenario, and need not be the same, in number. Moreover, this is only an example of the system 100, and the number and types of entities may vary based on a particular deployment and use case scenario, such as attributes and characteristics of the TMD 110, the mounting assemblies 120a-n, the PCB 130, and/or the self-equalizing frame assembly 140 itself. Additionally, the same numeric references denote analogous components throughout the disclosure.

The TMD 110 may be any heat-dissipating or thermal energy directing device and is not limited to a heatsink. The TMD 110 is configured to maximize area in contact with a cooling medium such as air surrounding the TMD 110. The TMD 110 dissipates thermal energy generated by an electronic component into the surrounding environment by convection and/or conduction. The TMD 110 may have various shapes, sizes, materials, and configurations. The TMD 110 may be copper, aluminum, or other suitable material. The TMD 110 may be configured to circulate air and/or a cooling fluid. The TMD 110 is installed onto the PCB 130 to cool a silicon device or an electronic component thereon (not shown).

In the system 100, the TMD 110 is a heatsink and includes a base 112, fins 114, and installation holes 116. This is but one non-limiting example of the components of the TMD 110. Further, the number of fins 114 may vary. Moreover, length, height, width of the fins 114, the base 112, and the installation holes 116 may vary based on a particular use case scenario.

The PCB 130 may include various other components (not shown) and this is just one non-limiting example. That is, the TMD 110 can be installed on various types of electronic components such as an electronic chip, CPU, GPU, etc. The TMD 110 and the PCB 130 operate on any type of device such as servers, gateways, access points, controllers, routers, switches, and/or other network devices or management nodes. For example, a network device may include a number of electronic components (and TMDs for cooling) to perform networking functions. As another example, a management node may include a number of electronic components (and TMDs for cooling) to perform various control, management and data storage functions. In one implementation, there may be one-to-one correspondence between the electronic components and TMDs but in another implementation, several TMDs may cool one electronic component, and yet in another implementation, one TMD 110 may cool several electronic components mounted on the PCB 130.

The installation holes 116 are for mounting the TMD 110 onto the PCB 130 using the plurality of mounting assemblies 120a-n. Location, size, and number of the installation holes 116 may vary based on a particular use case scenario.

The mounting assemblies 120a-n are configured to securely mount or attach the TMD 110 to the PCB 130 and/or silicon device (electronic component), etc. One example of the mounting assemblies 120a-n is TMD force-control mounting assemblies (TFCMAs) that have threaded fasteners and springs. The fasteners are inserted into the installation holes 116 of the TMD 110 and attach to the PCB 130 and/or a base plate (not shown). In one example, the fasteners are spring-loaded fasteners but this is just an example. Other types of mounting assemblies 120a-n are within the scope of the disclosure such as threaded bolts with nuts, washers, etc. The number of the mounting assemblies 120a-n may vary based on the characteristics of the TMD 110 and other mounting points may exist (six, seven, eight, etc.). Further, the location of the mounting assemblies 120a-n may vary widely, based on the TMD 110, the PCB 130, and the electronic component(s) thereon with some installations fixed in a symmetric array, and others in asymmetric configurations.

The self-equalizing frame assembly 140 includes a plurality of compression interfaces 142a-n, a frame 144, and a compression sensor 146.

The compression interfaces 142a-n compress the mounting assemblies 120a-n to a predetermined loading point. In one example, each of the compression interfaces 142a-n is configured to lock with and compress a respective mounting assembly at a respective assembly point 150. The compression interfaces 142a-n are linear compression interfaces but this is just an example. Other types of compression interfaces are within the scope of the disclosure such as fork-shaped compression interfaces. Commonly assigned U.S. patent application Ser. No. 17/826,864, filed May 27, 2022, titled "CONTROLLED-FORCE THERMAL MANAGEMENT DEVICE INSTALLATION", provides some examples of various types of the compression interfaces 142a-n and mounting assemblies 120a-n, and is incorporated herein by reference.

The frame 144 is configured to fully articulate to balance the preload force across and/or between compression interfaces 142a-n at respective assembly points. In other words, the frame 144 fully articulates to automatically equilibrate the mounting assemblies 120a-n (fastener loading). For example, by articulating, the frame 144 may compensate for fastener height differences caused by spring-constant tolerances or unloaded spring component height variation of the mounting assemblies 120a-n. The length, height, width, shape, and material of the frame 144 may vary based on a particular use case scenario such as type and number of compression interfaces 142a-n and their locations. In one example, the frame 144 may include stainless steel or another metal, and/or plastic, etc. The frame 144 includes a plurality of articulating joints 152a-n and a free-moving connector 154 that cause the frame to articulate and self-balance. While in this example, only one free-moving connector 154 is illustrated, having multiple free-moving connectors 154 is within the scope of this disclosure.

Figure 3:
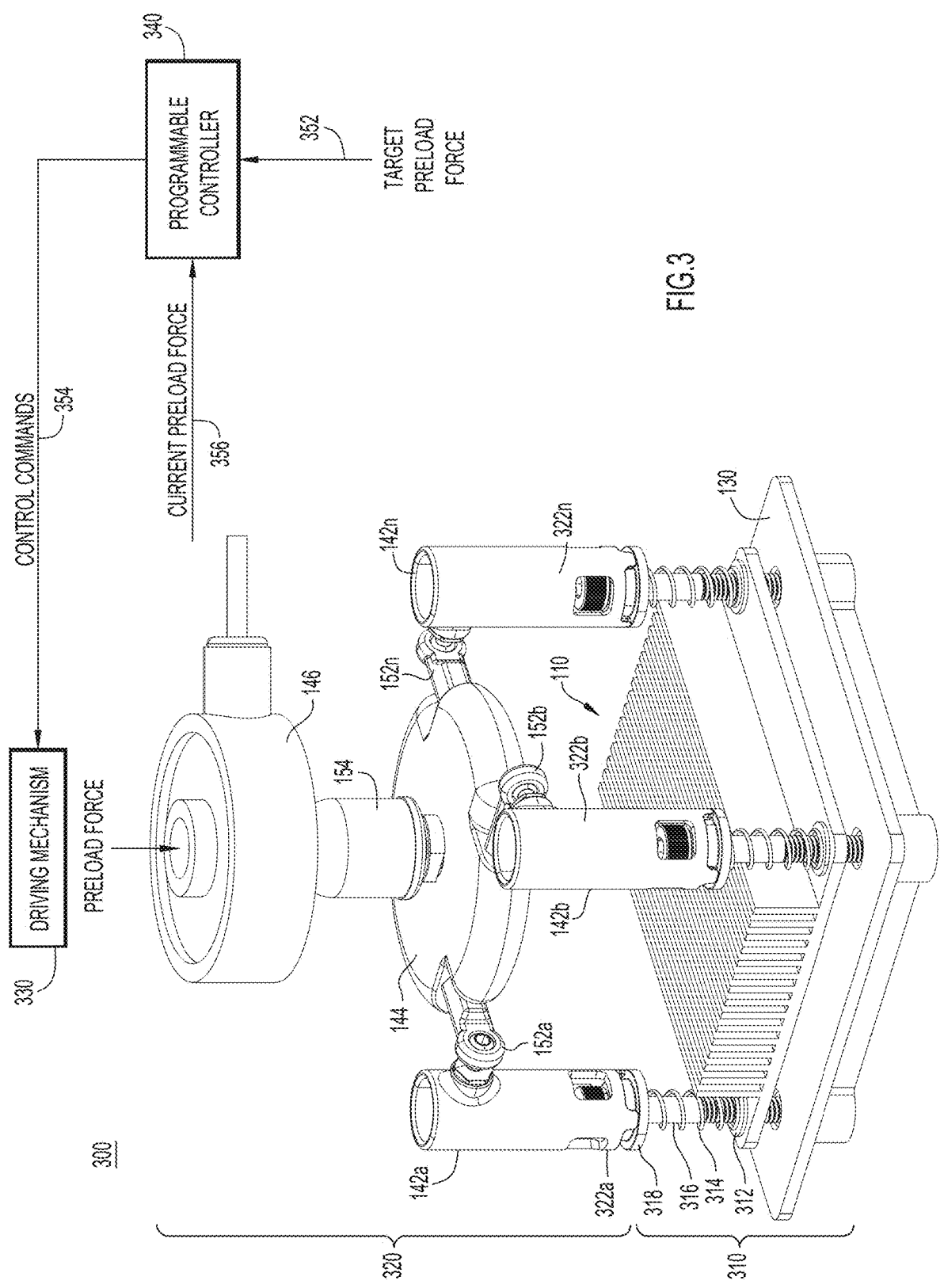
FIG. 3 is a part side perspective view and part diagram of a system for applying balanced and controlled preload force to mounting assemblies, according to an example embodiment.

The plurality of articulating joints 152a-n are provided, each at a respective assembly point. One example assembly point is illustrated by a circle at 150. The plurality of articulating joints 152a-n connect the frame 144 to the plurality of compression interfaces 142a-n at a periphery thereof. The plurality of articulating joints 152a-n may be located at the edges of the frame 144 but this is just an example. The plurality of articulating joints 152a-n may be placed at other locations along the periphery of the frame 144 or at other portions of the frame 144 depending on the location of the compression interfaces 142a-n. In one example, the compression interfaces 142a-n may be symmetrically arranged with respect to the frame 144. In yet another example, the compression interfaces 142a-n may be asymmetrically arranged with respect to the frame 144, as shown in FIG. 3 is described below.

The free-moving connector 154 may be a ball and socket connector that causes the frame 144 to continuously articulate during preloading of the mounting assemblies 120a-n. By continuously articulating, the frame 144 equalizes the preload force between the compression interfaces 142a-n. The free-moving connector 154 may be located at a top side (above) the frame 144. In other words, the frame 144 is attached from above to the compression sensor 146 via the free-moving connector 154. The frame 144 has an opening 156 to receive one end of the free-moving connector 154. In one example, the free-moving connector 154 may be positioned substantially at a center of the frame 144 e.g., for symmetrically arranged compression interfaces 142a-n. In yet another example, the free-moving connector 154 may be shifted from the center of the frame 144 to accommodate an asymmetrical arrangement of the compression interfaces 142a-n. The other end of the free-moving connector 154 may be attached to the compression sensor 146 and/or a driving mechanism (not shown). For example, the compression sensor 146 may include an opening 158 to receive the other end of the free-moving connector 154.

The compression sensor 146 may be any type of force detector such as an instrumented load cell, a one-dimensional compression sensor, an electronic force gage, etc.

configured to sense the compression force i.e., detect a current preload force being applied to the frame 144. The compression sensor 146 senses or detects the current preload force being applied to the frame 144 (in lbs., kg, etc.) and converts the measured physical force to a suitable output such as an analog voltage or a digital figure. The compression sensor 146 may have various shapes e.g., linear or toroidal. The compression sensor 146 is in turn affixed to a driving mechanism (not shown). The driving mechanism lowers the self-equalizing frame assembly 140 onto the mounting assemblies 120a-n and applies vertical force (preload force shown at 160), which is measured by the compression sensor 146. The compression sensor 146 may also include a multi-axis sensing capability to detect side-loading, for example, in addition to the aforementioned axial force.

Figure 2:
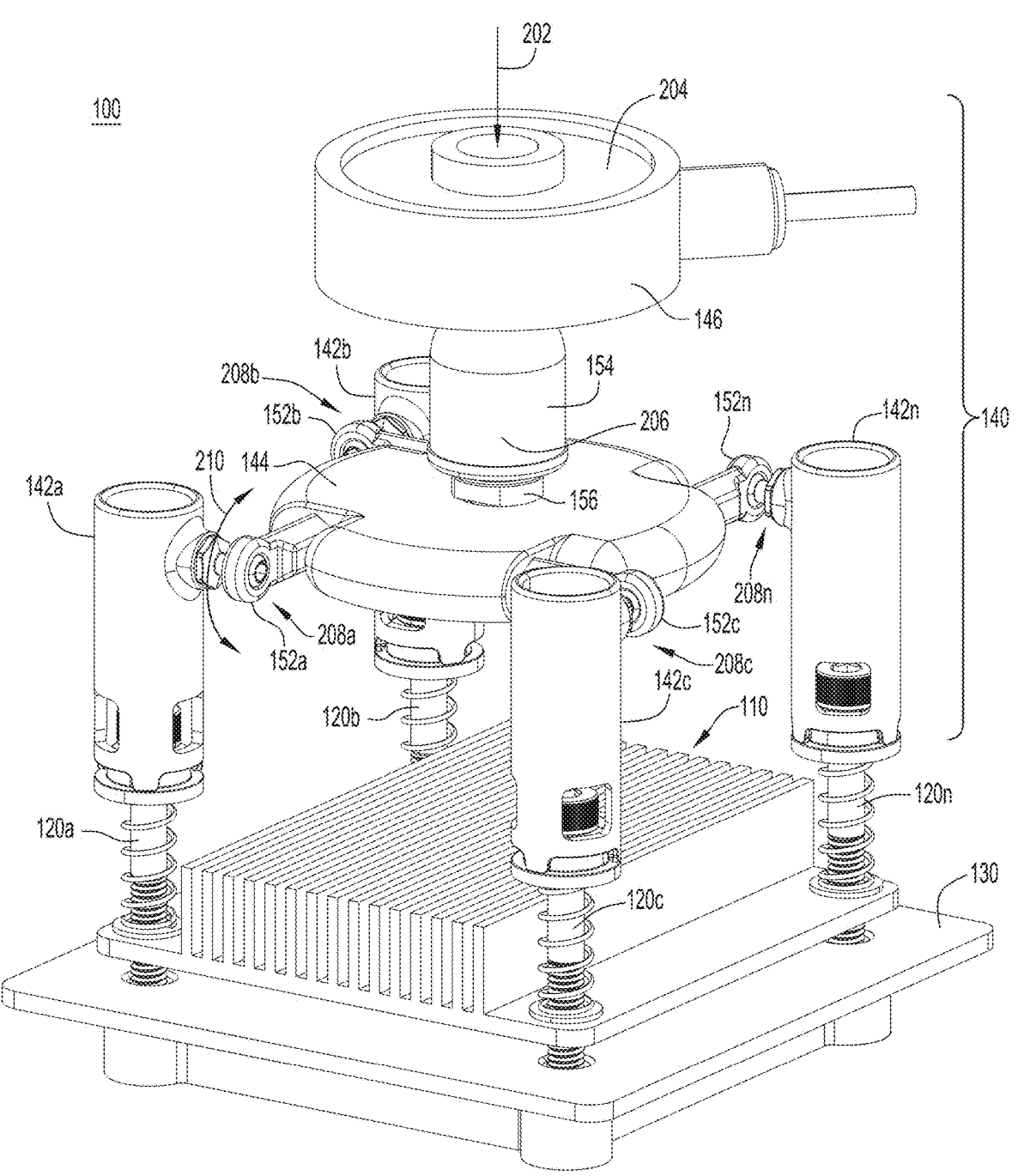
FIG. 2 is another side perspective view of the system of FIG. 1 illustrating the self-equalizing TMD preload frame assembly engaging the mounting assemblies for preloading during the installation of the TDM onto the PCB, according to an example embodiment.

With continued reference to FIG. 1, FIG. 2 is another side perspective view of the system 100 illustrating the self-equalizing frame assembly 140 engaging the mounting assemblies 120a-n, according to an example embodiment.

To perform the preloading by compressing the mounting assemblies 120a-n to a predetermined loading point, the self-equalizing frame assembly 140 is lowered by having a preload force, shown at 202, applied thereto. The compression sensor 146 (such as a load cell) senses a current preload force, shown at 204. The current preload force is provided back to a programmable controller (not shown), which in turn compares the current preload force and the target preload force to generate the needed preload force (in a form of a control command) for the driving mechanism (not shown).

Because of the free-moving connector 154, the frame 144 essentially "floats". In other words, the frame 144 continuously articulates because of the free-moving connector 154 at a loading center of the frame 144, shown at 206. The frame 144 articulates while the preload force is applied thus equalizing the preload force at each assembly point. In other words, the frame 144 automatically equilibrates a first assembly point 208a, a second assembly point 208b, a third assembly point 208c, and the fourth assembly point 208n, with each other. The frame 144 compensates for various skews among a first mounting assembly 120a, a second mounting assembly 120b, a third mounting assembly 120c, and a fourth mounting assembly 120n e.g., for fasteners have height differences caused by spring-constant tolerances.

Additionally, a first articulating joint 152a connects a first compression interface 142a to the frame 144. Similarly, a second articulating joint 152b, a third articulating join 152c, and a fourth articulating joint 152n respectively connect a second compression interface 142b, a third compression interface 142c, and a fourth compression interface 142n, to the frame 144. By articulating the frame 144 with respective to the compression interfaces 142a-n, the articulating joints 152a-n compensate for angular differences of the frame 144, shown at 210.

The preload force (vertical force) is continuously applied onto the frame 144, which articulates to balance the preload force between the compression interfaces 142a-n until a predetermined loading point is reached. When the predetermined loading point is reached, the mounting assemblies 120a-n are secured to the PCB 130 and the self-equalizing frame assembly 140 is retracted or withdrawn.

With continued reference to FIGS. 1 and 2, FIG. 3 is a part side perspective view and a part diagram of a system 300 for applying balanced and controlled preload force to mounting assemblies, according to an example embodiment. The system 300 includes a plurality of mounting assemblies e.g., three mounting assemblies that are asymmetrically arranged with respect to the frame 144. One mounting assembly is depicted as a component stack 310. The system 300 further includes a self-equalizing TMD preload frame assembly 320, a driving mechanism 330, and a programmable controller 340.

In one example, the component stack 310 includes a washer 312, a spring 314, a fastener 316, and a coupler 318. This is but one non-limiting example of the component stack 310, a pushpin, and other mounting assemblies are within the scope of the disclosure. The component stack 310 may include additional components such as additional couplers, bushings, pushpins, holders, springs, nuts, etc. and/or omit some of these components. Other fasteners and component stacks that provide sufficient force to securely install the TMD 110 are within the scope of this disclosure. The component stack 310 is only an example of a mounting assembly and other mechanisms may be used with a compression interface to provide controlled, equalized, and verifiable preload force to the compression interfaces for installing the TMD 110.

The washer 312 is a circular flat stainless-steel or other suitable material ring that slips over the fastener 316 (threaded stud) and distributes the spring load to the TMD 110. The washer 312 surrounds a respective one of the installation holes and abuts against a base of the TMD 110.

The spring 314 is an example of a compression coil (e.g., a steel spring) that slips over the fastener 316 (threaded stud) and remains substantially collinear with the fastener 316. The spring 314 also typically includes ground ends that provide flat, even interfaces.

The fastener 316 may be in a form of a vertical threaded stud. The threaded stud may include an exterior thread (e.g., M4×0.7) that mates with the receptacles that are also threaded and situated in a base plate (not shown) and/or the PCB 130. In this example, the fastener 316 is a spring-loaded fastener or a stud.

The coupler 318 may be an annular bushing that houses the spring 314. The coupler 318 includes a short circular cylinder with an external annular rim. The coupler 318 (the bushing) slips over the fastener 316 (threaded stud) and sits atop the spring 314. The coupler 318 may include Oilite® bronze for strength and to reduce friction. The coupler 318 (the bushing) includes a threaded stud clearance hole and a cylindrical recess that captures the top of the spring 314, thus housing the spring 314 therein. The coupler 318 sidewall may be angled or beveled to provide lead-in that facilitates capturing spring 314 during assembly. Further, the top circular aperture edges of coupler 318 may be rounded to minimize sliding friction with fastener 316. Additionally, a nut (not shown) may be provided such as a standard hexagonal nut (M4 in this example) that screws onto the fastener 316 (threaded stud) and locks the coupler 318 into a specific vertical position.

Figure 4:
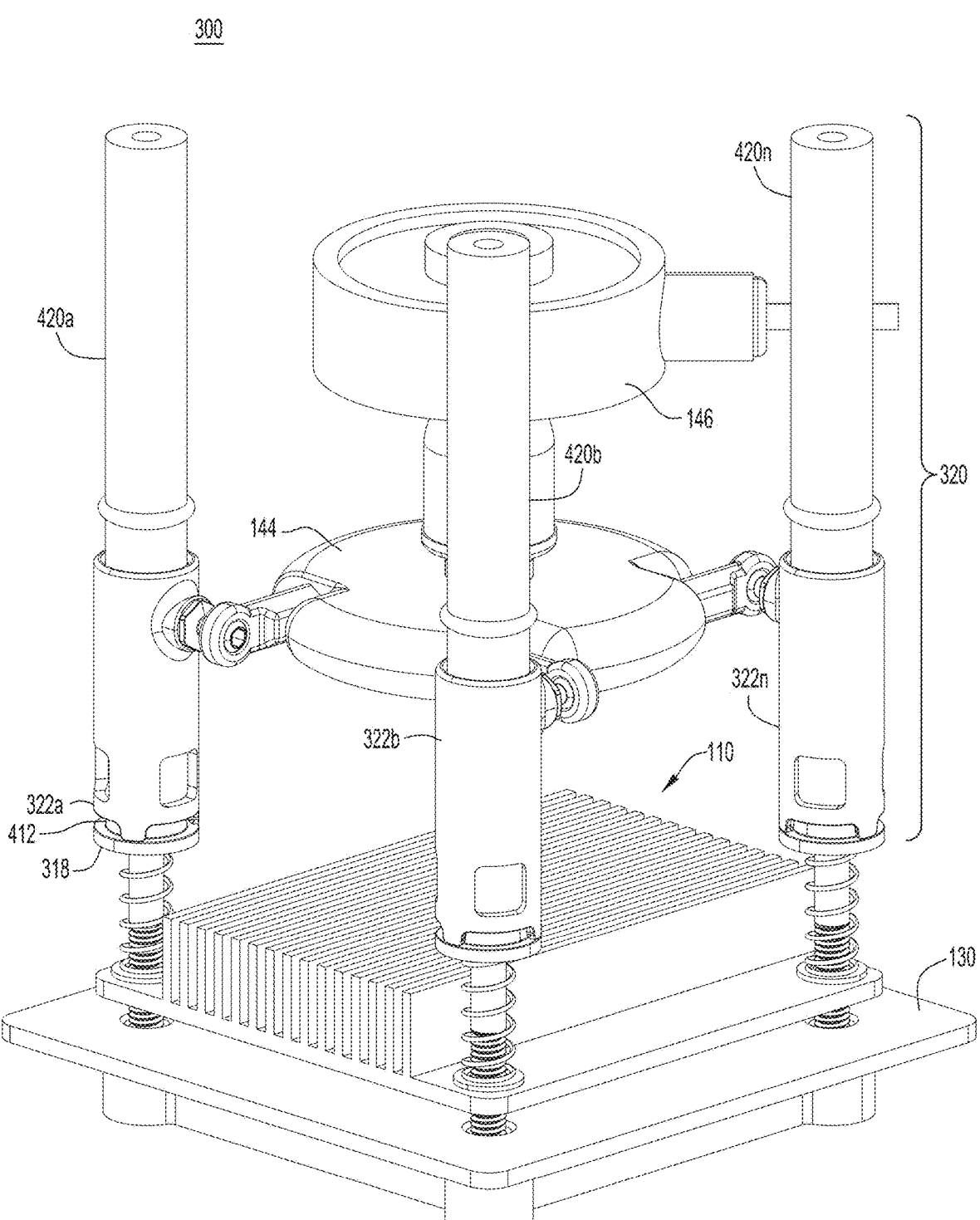
FIG. 4. is a side view of the system of FIG. 3 at a predetermined loading point in which the self-equalizing TMD preload frame assembly installs fasteners of the mounting assemblies, according to an example embodiment.
Figure 5:
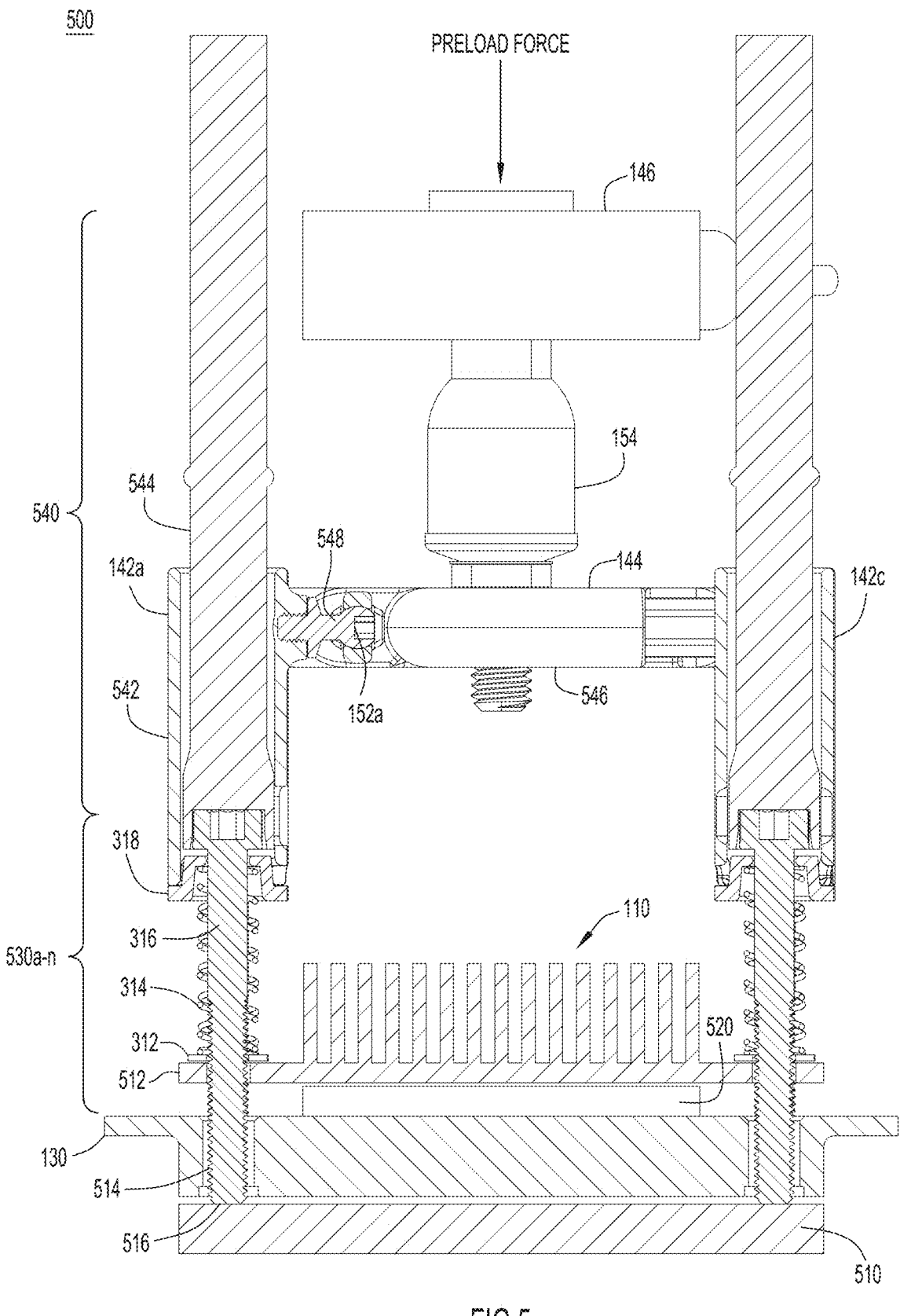
FIG. 5 is a cross-section view of a system having a self-equalizing TMD preload frame assembly for installing the TMD onto the PCB using mounting assemblies, according to an example embodiment.

The self-equalizing TMD preload frame assembly 320 includes asymmetrically arranged compression interfaces 142a-n to correspond to asymmetrically arranged mounting assemblies. The compression interfaces 142a-n include respective pushers 322a-n (and drivers shown in FIG. 4). A first pusher 322a locks with the coupler 318 and compresses the spring 314 to a predetermined loading point using a controlled force from the driving mechanism 330 that is balanced by the frame 144. A second pusher 322b and a third pusher 322n also lock with respective couplers of the other mounting assemblies and compress respective springs of these other mounting assemblies.

In one non-limiting example, the first pusher 322a is a linear compression interface that has a cylindrical shape. The first pusher 322a is positioned collinearly with the fastener 316 of the component stack 310 and applies a controlled vertical preload force. The first pusher 322a is particularly beneficial for engaging a mounting assembly in a difficult to reach mounting location (e.g., embedded mounting assembly), thus addressing tight mounting hardware constraints.

Specifically, the first pusher 322a may be in a form of a hollow cylindrical component (a hollow cylinder) that obtains vertical controlled preload force from the frame 144. The preload force is balanced with other preload forces applied by the second pusher 322b and the third pusher 322n, via the frame 144. The pushers 322a-n may be made of stainless steel, in one example. The first pusher 322a locks with and bears directly onto the component stack 310. For example, the first pusher 322a latches onto the coupler 318. Beveled side walls on the coupler 318 provide lead-in that helps facilitate engagement and release of the first pusher 322a.

While the compression interfaces 142a-n are shown in a form of the plurality of pushers 322a-n, this is just one example. The compression interfaces 142a-n may take other forms such as a form of a fork or equivalent. Depending on TMD installations, different types of compression interfaces may be used. Also, a combination of different types of compression interfaces within one self-equalizing TMD preload frame assembly 320 is within the scope of the disclosure. Different types of compression interfaces may especially be applicable for asymmetrical arrangements. For example, for difficult to reach mounting assembly, one of the pushers 322a-n may be used and for easily accessible mounting assemblies, fork-type compression interfaces may be used. In other words, the shape, size, and materials of the compression interfaces 142a-n may vary based on a particular use case and based on characteristics and a mounting location of the TMD 110 and the composition of a mounting assembly. The compression interfaces 142a-n are configured to lock with respective mounting assemblies at respective mounting locations or assembly points and apply a controlled and balanced preload force (vertical controlled and equalized compression force) obtained from the frame 144.

The frame 144 includes a plurality of articulating joints 152a-n such as ball and clevis joints. One articulating joint is provided for each pusher. The frame 144 also includes a free-moving connector 154 such as a ball and socket joint. The frame 144 is driven by the driving mechanism 330 until the predetermined loading point is reached.

According to one or more example embodiments, the driving mechanism 330 may be an instrumented actuator assembly. In another form, the driving mechanism 330 may be a motor. The driving mechanism 330 may be colinear with or offset from the frame 144. The driving mechanism 330 applies a preload force (vertical compression force) to the frame 144. The driving mechanism 330 is used in conjunction with the frame 144, and the compression interfaces 142a-n to set the TMD 110 at the desired preload force prior to securing the mounting assemblies in place.

The driving mechanism 330 is controlled by the programmable controller 340. The programmable controller 340 may include one or more processors and memory for storing instructions. The programmable controller 340 in conjunction with the driving mechanism 330 and the compression sensor 146 ensures that the frame 144 applies a balanced, equalized, predetermined, controlled, and verifiable preload force and reaches the predetermined loading point or target preload/compression force prior to securing the TMD 110 to the PCB 130.

The programmable controller 340 is configured to interface with and control the driving mechanism 330 and to receive feedback from the compression sensor 146, e.g., a current preload force detected by the compression sensor 146. By interfacing with the driving mechanism 330 and the compression sensor 146, the programmable controller 340 controls the overall assembly process or the installation process of the TMD 110, to provide software-controlled load magnitude and rate.

The assembly process involves attaching the TMD 110 to a silicon device and/or the PCB 130 and/or a base plate using one or more mounting assemblies. Specifically, the programmable controller 340 may control the assembly process as follows.

At 352, a predetermined loading point is input into the programmable controller 340. The predetermined loading point is the target preload force desired for the specific TMD mounting point (e.g., in pounds (lbs.), Newtons (N), etc.). The predetermined loading point may be based on previous analysis and/or testing. The predetermined loading point may be input by an operator or set based on the characteristics of the TMD 110 and the mounting assembly, automatically programmed directly from another system (such as statistical process control or quality yield management system) or may be a default value. For example, the predetermined loading point may be set as a function of the specific silicon type and configuration (not to crush the silicon) and/or compression load for the mounting assembly to work (e.g., for a thermal contact).

Additionally, the programmable controller 340 may obtain a loading/force/speed profile for the driving mechanism 330. That is, the profile may indicate that the driving mechanism 330 is to operate at a high speed until it is x % from the target loading point. At this point, the driving mechanism 330 is to switch to a slower speed until is it y % from the loading point and then to the slowest speed until the target force/loading point is reached. In other words, the profile may indicate that the speed of compressing the mounting assembly should be decreasing as the current preload/mounting force approaches the target preload force. This is but one non-limiting example of the profile. In another example, the profile may include varied speeds, forces, and various setpoints or % values.

The mounting assembly is placed onto the TMD 110. For example, a washer 312, a spring 314, a coupler 318 (annular bushing), and a nut (not shown) may be positioned onto the fastener 316 (threaded stud) that is inserted through assembly holes of the TMD 110 and the PCB 130.

At 354, the programmable controller 340 communicates with the driving mechanism 330 so that the frame 144 is compressed and articulated to provide a balanced and equalized preload force to the pushers 322a-n. The free-moving connector 154 may be located outside the center of the frame 144 to accommodate for the asymmetrical arrangement of the pushers 322a-n. The pushers 322a-n preload or compress the mounting assemblies to the predetermined loading point. The programmable controller 340 generates one or more commands based on the target preload force. The programmable controller 340 sends commands/signals to the driving mechanism 330 to drive or extend the frame 144 at a predetermined preload or mounting force to compress the pushers 322a-n while compensating for any disbalances between these pushers 322a-n and the angular differences of the frame 144 by articulating using the articulating joints 152*a-n* and the free-moving connector 154.

The frame 144 allows improved control over the TMD 110 and silicon device co-planarity, and also addresses circumstances in which there is a lack of planarity for which active compensation in installing the TMD 110 is useful. Articulating the frame 144 is also useful to handle a TMD 110 with a complicated geometry, i.e., when the TMD 110 is not symmetrical. In one example, the frame 144 articulates and thus equilibrates the loading at different assembly points. This helps avoid applying different forces on a silicon device, thus providing substantially linear compression while minimizing shear forces experienced by the silicon device. Further, since articulating the frame 144 provides for equally distributed preload forces at various assembly points, rocking the TMD 110 is avoided/prevented.

At 356, the programmable controller 340 obtains a continuous force feedback from the compression sensor 146 through a control-feedback loop. The continuous force feedback indicates current preload force and/or current loading point of the mounting assemblies. The continuous force feedback provides direct measurements (detected, sensed values) of the current preload force and/or loading point. Specifically, the compression sensor 146 continuously detects the current preload force applied to the frame 144 and provides the measure(s) to the programmable controller 340. Various measures such as machine learning and artificial intelligence may be used to help characterize, tune, and optimize the control and feedback process. The control-feedback loop provides direct measurements (detected values) of the current preload force.

The programmable controller 340 drives the driving mechanism 330 until the predetermined loading point and/or target preload force is reached. As noted above, the programmable controller 340 may drive the driving mechanism 330 at a slower speed (decreasing the speed) as the frame 144 approaches the target preload force and/or the predetermined loading point. The driving mechanism 330 is driven until the desired loading point/target preload force is reached. In one example, the degree of preload force applied and the speed may be varied using a profile of the driving mechanism 330. In addition, for example, a profile of the programmable controller 340 is designated to overshoot a loading setpoint by a specified force to allow for any force relaxation during the interface locking process that may be identified during system testing. Further, programmable controller 340 may be programmed to induce an oscillatory or other non-linear force pattern to help set a TIM or to condition the springs by preloading.

With continued reference to FIGS. 1-3, FIG. 4 is a side view of the system 300 at a predetermined loading point in which the self-equalizing TMD preload frame assembly 320 installs fasteners of the mounting assemblies, according to an example embodiment. The system 300 illustrates a plurality of mounting assemblies 410*a-n* and further includes a plurality of fastener drivers 420*a-n*.

Each of the plurality of mounting assemblies 410*a-n* includes the component stack 310. Additionally, the component stack 310 includes a nut 412. The nut 412 may be placed on the fastener 316 above the coupler 318.

Each of the fastener drivers 420*a-n* (first fastener driver 420*a*, a second fastener driver 420*b*, and a third fastener driver 420*n*) may be a hex driver component having a cylinder shape and freely rotating within a respective collinear pusher (hollow cylinder). The fastener drivers 420*a-n* are nested inside respective pushers 322*a-n*. The fastener drivers 420*a-n* are also positioned collinearly with the fasteners of the mounting assemblies. The fastener drivers 420*a-n* holds the nut 412 of the respective mounting assembly and screws the nut 412 onto the respective fastener 316, such as the threaded stud, thus securing the fastener 316 therein. In some implementations, the fastener drivers 420*a-n* may be made of magnetized steel or comprise a non-magnetic body that includes an embedded magnetic element, both of which help to conveniently retain the nut 412 during assembly.

As explained above, the pushers 322*a-n* lock with (from above) and apply downward compression force (a vertical controlled preload force) onto the mounting assemblies thus compressing the mounting assemblies to a predetermined loading point (preloading). The fasteners are then secured therein e.g., by screwing the nut 412 or by applying other mechanical means to secure the fasteners therein. In other words, when the predetermined loading point is reached, each of the fastener drivers 420*a-n* (such as a first fastener driver 420*a* nested inside the first pusher 322*a*), threads the nut 412 onto the fastener 316, thus securing the fastener 316 therein. In one example, the fastener drivers 420*a-n* have a hexagonal cutout at its lower end that fits over the nut 412. This allows the fastener drivers 420*a-n* to thread the nuts onto the fasteners (threaded stud) without disturbing the pushers 322*a-n* or bearing once they are in the predetermined loading position or at the predetermined loading point (by freely rotating therein). To ensure that the nut 412 remains in place after installation, further measures such as an additional lock nut or fixative substances may be applied. For example, Loctite may be applied to an interface of the nut 412 and the fastener 316. After the installation of the TMD 110 is complete, the self-equalizing TMD preload frame assembly 320 is retracted/withdrawn. That is, based on one or more commands from the programmable controller 340, the driving mechanism 330 withdraws the self-equalizing TMD preload frame assembly 320 (compression interfaces and frame) when the TMD 110 is secured to the PCB 130.

With continued reference to FIGS. 1-4, FIG. 5 is a cross-section view of a system 500 having a self-equalizing TMD preload frame assembly for installing the TMD onto the PCB using mounting assemblies, according to an example embodiment. The system 500 includes a base plate 510, the PCB 130, a silicon device 520, the TMD 110, the mounting assemblies 530*a-n* such as the mounting assemblies 120*a-n* (individually referred to as the component stack 310), and a self-equalizing TMD preload frame assembly 540 such as the self-equalizing frame assembly 140 or the self-equalizing TMD preload frame assembly 320.

The base plate 510 may be made of metal material such as stainless steel but is not limited thereto. The base plate 510 is rigidly affixed to an underside of the PCB 130 by adhesives, interference fits, or other suitable means. The base plate 510 includes receptacles to receive and hold the fasteners of the mounting assemblies 530*a-n* (such as a second mounting assembly 530*b* and a third mounting assembly 530*n*, shown in FIG. 6 below). For example, the fastener 316 of one of the mounting assemblies 530*a-n* is inserted through an installation hole 512 of the TMD 110, through a clearance hole 514 of the PCB 130, and into a receptacle 516 of the base plate 510. The installation hole 512, the clearance hole 514, and the receptacle 516 substantially align with one another so that the respective fastener 316 is inserted therethrough and is screwed rigidly into the base plate 510.

The silicon device 520 is one example of an electronic component that is mounted onto the PCB 130 and is cooled by the TMD 110. The silicon device 520 is disposed between the TMD 110 and the PCB 130. Specifically, the TMD 110 is mounted onto the silicon device 520 such that it is offset from the PCB 130.

The self-equalizing TMD preload frame assembly 540 includes the plurality of compression interfaces 142*a-n* and the frame 144. Each of the plurality of compression interfaces 142*a-n* includes a pusher 542 and a driver 544 such as one of the drivers 420*a-n*, nested inside the pusher 542.

The pusher 542 locks with the coupler 318 and compresses the spring 314. Spring-constant tolerance differences will cause the fastener 316 to compress at a different rate and loading from other fasteners of the mounting assemblies 530*a-n*. The frame 144 equilibrates these force differences as the frame 144 essentially "floats" on the free-moving connector 154 and the articulating joints such as the first articulating joint 152*a*. The free-moving connector 154 such as a ball and socket joint, is placed between the compression sensor 146 at the top of the frame 144, and the compression interfaces 142*a-n*. Since the ball and socket is placed at the "loading center" of the frame 144, the frame 144 articulates continually to make the preloading force equal at each assembly point. The frame 144 includes a connecting hole 546 for attaching to the free-moving connector 154. The other end of the free-moving connector 154 is secured in an opening of the compression sensor 146.

The pusher 542 is attached to the frame 144 via the first articulating joint 152*a* such as a ball and clevis joint or a ball-end connector. The first articulating joint 152*a* causes the frame 144 to articulate and compensate for angular differences of the frame 144. The first articulating joint 152*a* connects to the periphery of the pusher 542 such as being screwed into a cavity 548 in the periphery of the pusher 542. The periphery of the pusher 542 may include external side thereof or a periphery portion or part.

When the mounting assemblies 530*a-n* reach the predetermined loading point, the driver 544 (nested inside and without contacting the pusher 542) secures the fastener 316. When the fasteners are secured thus installing the TMD 110, the self-equalizing TMD preload frame assembly 540 is retracted and/or withdrawn. In other words, when the TMD 110 is installed, the self-equalizing TMD preload frame assembly 540 is removed or forced to withdraw via the driving mechanism, for example.

Figure 6:
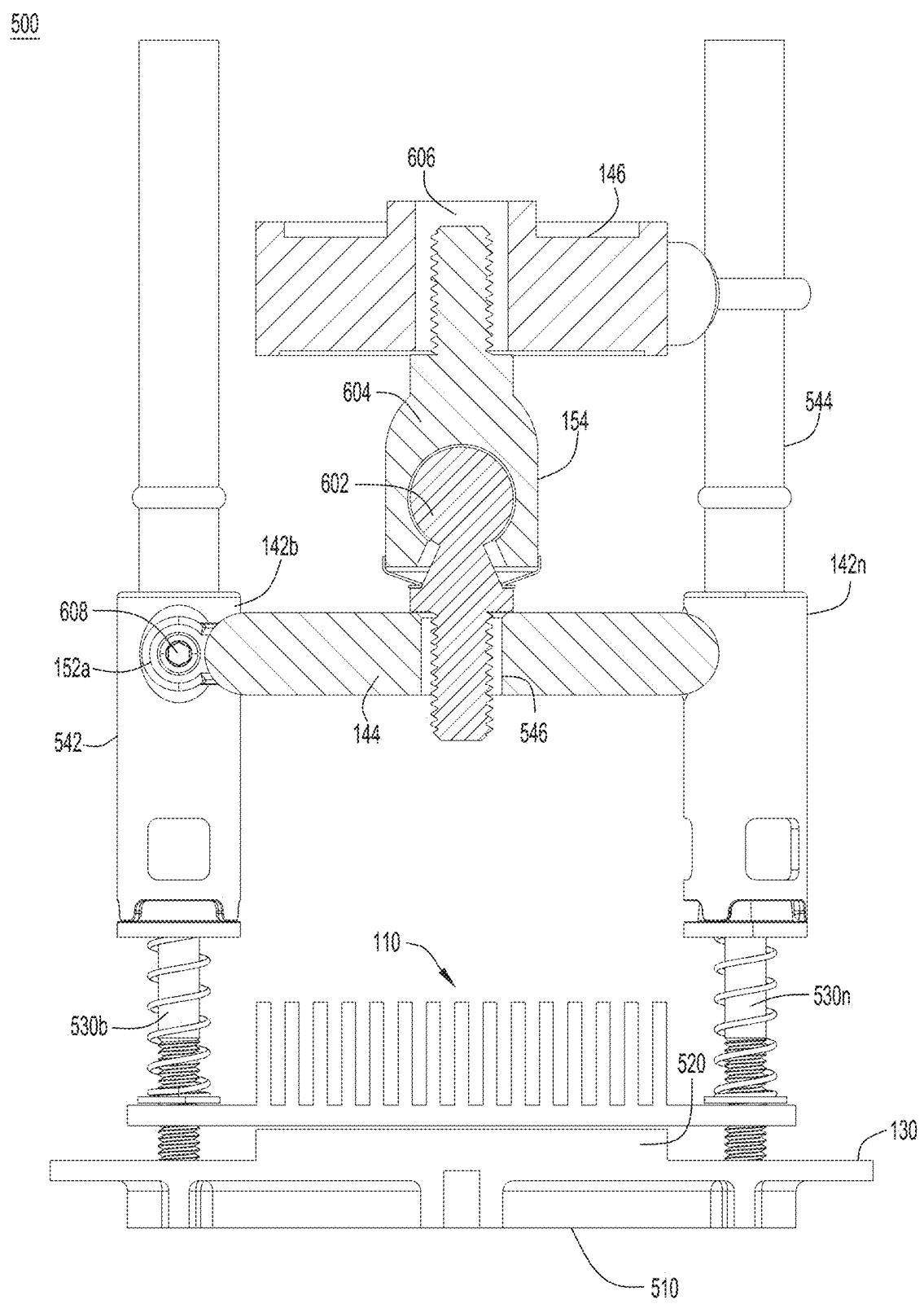
FIG. 6 is another cross-section view of the system of FIG. 5, according to an example embodiment.

With continued references to FIGS. 1-5, FIG. 6 is another cross-section view of the system 500, according to an example embodiment. As shown in FIG. 6, the free-moving connector 154 includes a ball part 602 and a socket joint 604.

The ball part 602 sits inside the socket joint 604 and is configured to freely rotate therein. By rotating therein, the frame 144 articulates to balance the preload forces at the assembly points. The socket joint 604 is attached to the compression sensor 146 through a cavity 606 in the compression sensor 146. For example, the socket joint 604 may be threaded into the cavity 606 of the compression sensor 146.

The frame 144 is attached to the compression interfaces 142*a-n* via the articulating joints 152*a-n*. Each of the articulating joints 152*a-n* includes a ball part (shown in FIG. 5) and a clevis joint 608. The clevis joint 608 is attached to the periphery portion of the pusher 542 with the ball part attached to the frame 144 to compensate for angular differences of the frame 144. That is, while the frame 144 applies vertical preload force to the compression interfaces 142*a-n* (pushers), it can still rotate via the articulating joints 152*a-n*.

That is, using the articulating joints 152*a-n*, the frame 144 transfers the vertical preload force but maintains freedom of motion in rotation.

Depending on various designs of the systems and their components (compression interfaces, mounting assemblies, etc.) freedom of movement of the pivoting joints may need to be limited or restricted. For example, side forces added by the independently articulating joints explained above may not be desirable in some system designs. In one or more example embodiments, the pivoting joints have a limited degree of movement in that they rotate only and do not freely articulate, as detailed below.

Figure 7:
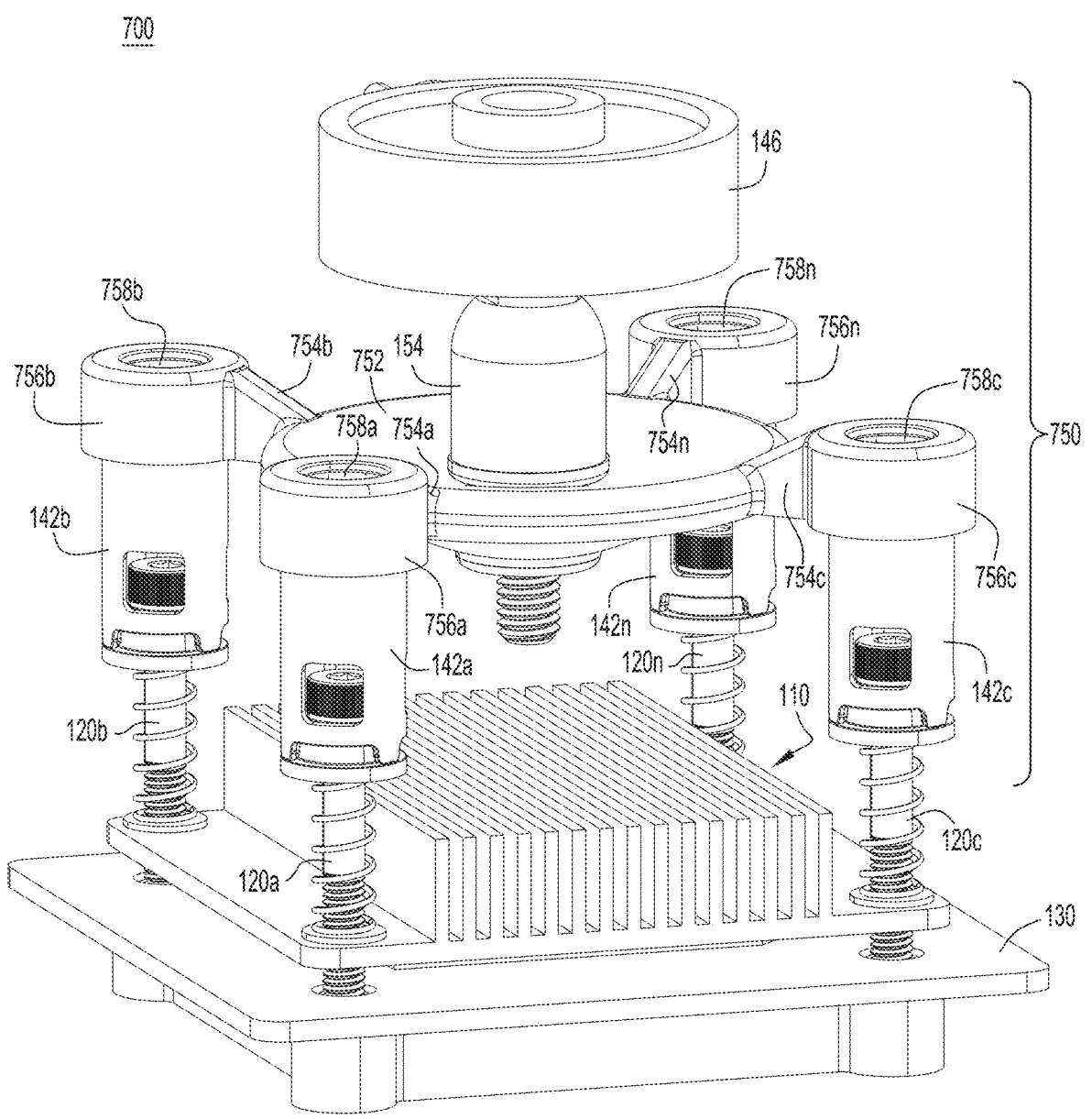
FIG. 7 is a side perspective view of a system having a self-equalizing TMD preload frame assembly with donut-shaped joints for balancing a preload force at assembly points when installing the TMD, according to another example embodiment.

FIG. 7 is a side perspective view of a system 700 having a self-equalizing TMD preload frame assembly with donut-shaped joints for balancing a preload force at assembly points when installing the TMD, according to another example embodiment.

The system 700 includes the TMD 110, the plurality of mounting assemblies 120*a-n*, the PCB 130, the compression sensor 146, and the self-equalizing TMD preload frame assembly with donut-shaped joints (referred to as a frame assembly) 750. The system 700 is depicted after the frame assembly 750 engages with the plurality of mounting assemblies 120*a-n*.

The frame assembly 750 includes the plurality of compression interfaces 142*a-n* and the free-moving connector 154, described in detail above. The frame assembly 750 further includes a main body 752, a plurality of arms 754*a-n*, and a plurality of pivoting joints 756*a-n*.

The main body 752 may be a metal frame such as the ones described above. The plurality of arms 754*a-n* (a first arm 754*a*, a second arm 754*b*, a third arm 754*c*, and a fourth arm 754*n*) are integrally formed with the main body 752. In another example embodiment, the plurality of arms 754*a-n* may be a separate component that is attached to the main body 752. Each of the plurality of arms 754*a-n* supports a respective one of the plurality of pivoting joints 756*a-n* (a first pivoting joint 756*a*, a second pivoting joint 756*b*, a third pivoting joint 756*c*, and a fourth pivoting joint 756*n*).

The pivoting joints 756*a-n* do not articulate but can only pivot and/or rotate around respective virtual pivot points (rotational centers) shown as the virtual pivots 758*a-n* (a first virtual pivot 758*a*, a second virtual pivot 758*b*, a third virtual pivot 758*c*, and a fourth virtual pivot 758*n*). Each of the pivoting joints 756*a-n* is donut-shaped. Each surrounds a respective one of the compression interfaces 142*a-n* (and more specifically, the pusher component). The compression interface is nested inside a respective one of the pivoting joints 756*a-n*, as detailed below.

Each of the pivoting joints 756*a-n* has a hole that allows the driver component of the compression interfaces 142*a-n* to be inserted therein and access the fastener of the mounting assemblies 120*a-n*. The center of the holes is the virtual pivot points 758*a-n* around which the pivoting joints 756*a-n* rotate.

Figure 8:
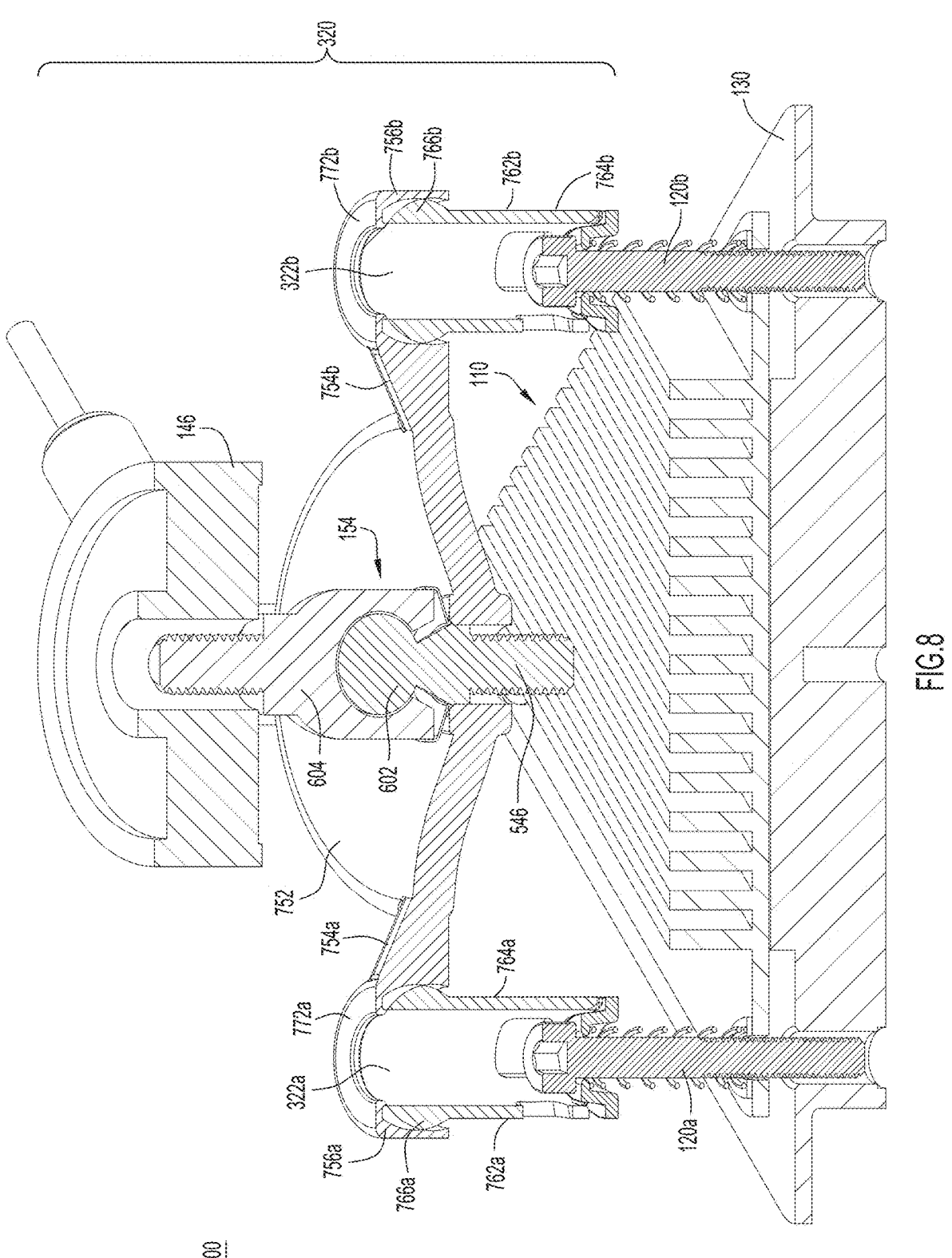
FIG. 8 is a cross-section view of the system of FIG. 7, according to another example embodiment.

With continued reference to FIG. 7, FIG. 8 is a cross-section view of the system 700, according to another example embodiment. In FIG. 8, the system 700 includes the first mounting assembly 120*a*, the second mounting assembly 120*b*, and the frame assembly 750.

The frame assembly 750 includes the first compression interface 142*a* having a first pusher 762*a*, the second compression interface 142*b* having a second pusher 762*b*, the first pivoting joint 756*a*, the second pivoting joint 756*b*, the first arm 754*a*, the second arm 754*b*, and the main body 752. In the description below, the interactions of the frame assembly 750 are explained with respect to one mounting assembly (the first mounting assembly 120*a*), for the sake of brevity. The description applies to other mounting assemblies. That is, other compression interfaces and the pivoting joints of the frame assembly 750 are similarly designed and configured.

The first pusher 762*a* and the second pusher 762*b* are hollow cylinders. The first pusher 762*a* has a first bottom portion 764*a* and a first rounded portion 766*a*. The second pusher 762*b* has a second bottom portion 764*b* and a second rounded portion 766*b*. The first rounded portion 766*a* and the second rounded portion 766*b* are top portions and are formed at a location of an overlap with the respective pivoting joint. For example, the first pusher 762*a* is surrounded by the first pivoting joint 756*a* at the first rounded portion 766*a*. The first pivoting joint 756*a* extends over the first pusher 762*a* on a peripheral side thereof.

To restrict degrees of movement (especially side movement), the first pusher 762*a* pivots or rotates around the respective virtual pivot (shown in FIG. 7). A spherical interface is thus formed between the main body 752 and the first pusher 762*a*. The first pusher 762*a* and the first pivoting joint 756*a* rotate around the same virtual rotational center. The pivot point is no longer offset but is aligned with the fastener of the first mounting assembly 120*a*. As such, there are no side mounting forces interfering with the pre-load of the first mounting assembly 120*a*. Rounded edges of the first pivoting joint 756*a* and the first rounded portion 766*a* provide spherical rotations therein. The first pivoting joint 756*a* has a first edge 772*a* and the second pivoting joint 756*b* has a second edge 772*b*. The first edge 772*a* surrounds a portion of the first pusher 762*a* from the top to secure the first pusher 762*a* therein.

FIG. 9 is a flow chart illustrating a method 900 of preloading a mounting assembly for installing a thermal management device, according to an example embodiment.

The method 900 involves at 902, setting, by a programmable controller, a target preload force associated with a mounting force applied to a mounting assembly for installing a thermal management device. The programmable controller may be the programmable controller 340 of FIG. 3. At 904, the programmable controller generates one or more commands based on the target preload force.

The method 900 further involves at 906, compressing, by a driving mechanism, a frame, based on the one or more commands, until the mounting assembly reaches the target preload force, the frame applies a continuous controlled force to at least two compression interfaces that compress the mounting assembly. The frame has a pivoting joint at an assembly point for each of the at least two compression interfaces that balances the continuous controlled force between the at least two compression interfaces. The driving mechanism may be the driving mechanism 330 of FIG. 3.

According to one or more example embodiments, the method 900 further involves securing the thermal management device to a printed circuit board using the mounting assembly when the target preload force is reached and controlling, based on the one or more commands, the driving mechanism to withdraw the at least two compression interfaces and the frame when the thermal management device is secured to the printed circuit board.

In one form, the mounting assembly may include at least two spring-loaded fasteners and at least two couplers. The operation 906 of compressing the frame may include applying the continuous controlled force by the at least two compression interfaces to the at least two couplers to compress respective springs of the at least two spring-loaded fasteners to the target preload force while the frame articulates to compensate for height differences between the at least two spring-loaded fasteners. Securing the thermal management device may include attaching the thermal management device using respective fasteners of the at least two spring-loaded fasteners when the respective springs are compressed to the target preload force.

In one instance, the operation 904 of generating the one or more commands may include obtaining, by the programmable controller, a current preload force measured by a compression sensor and generating a driving command for the driving mechanism based on the current preload force and the target preload force.

In another example embodiment, an apparatus is provided. The apparatus includes at least two compression interfaces and a frame. Each of the at least two compression interfaces compresses a mounting assembly of a thermal management device to a predetermined loading point. The frame is configured to apply a preload force to the at least two compression interfaces. The frame has a pivoting joint at an assembly point for each of the at least two compression interfaces to balance the preload force between the at least two compression interfaces.

According to one or more example embodiments, the frame may include a free-moving connector that connects the frame to a driving mechanism for providing the preload force to the frame.

In one instance, the free-moving connector may be a ball and socket connector that causes the frame to continuously articulate to equalize the preload force between the at least two compression interfaces.

In another instance, the apparatus may further include a compression sensor that measures a current preload force being applied to the frame. The free-moving connector may be located substantially at a center of the frame and may have a first end secured in an opening of the compression sensor and a second end secured in an opening of the frame.

According to one or more example embodiments, the free-moving connector may be located outside a center of the frame to accommodate for an asymmetrical arrangement of the at least two compression interfaces.

In one form, the frame may be attached, via the pivoting joint, to a periphery side of each of the at least two compression interfaces.

In another form, the frame may have a plurality of respective pivoting joints. Periphery portions of the frame are attached, via the plurality of respective pivoting joints, to the at least two compression interfaces.

According to one or more example embodiments, the at least two compression interfaces may include a plurality of compression interfaces that are symmetrically arranged with respect to the frame.

In one instance, the plurality of respective pivoting joints may be one of: a plurality of ball and clevis joints that articulate freely with respect to a corresponding compression interface or a plurality of donut shaped joints that pivot around the corresponding compression interface.

In another instance, the mounting assembly may include a fastener and a coupler. Each of the at least two compression interfaces may include a pusher configured to lock with the coupler and compress the mounting assembly and a driver, nested inside the pusher, configured to install the fastener when the predetermined loading point is reached.

According to one or more example embodiments, the fastener may be spring-loaded. A spring of the fastener may compress to the predetermined loading point by the pusher while locked with the coupler prior to the fastener being secured therein.

In one form, the pivoting joint may be donut-shaped and may have a virtual pivot point at a center of the hole such that the pivoting joint rotates with respect to the pusher of a corresponding compression interface.

In one instance, the frame and the at least two compression interfaces may be removed after the thermal management device is secured, via the mounting assembly, to a printed circuit board.

In yet another example embodiment, a system is provided. The system includes a programmable controller, at least two compression interfaces, a frame, and a driving mechanism. The programmable controller is configured to generate one or more commands to control an installation of a thermal management device using a mounting assembly. Each of the at least two compression interfaces is for compressing the mounting assembly to a predetermined loading point. The frame is configured to apply a preload force to the at least two compression interfaces. The frame has a pivoting joint at an assembly point for each of the at least two compression interfaces to balance the preload force between the at least two compression interfaces. The driving mechanism is configured to drive the frame until the mounting assembly reaches the predetermined loading point, based on the one or more commands.

In one form, the system may further include a compression sensor that measures a current preload force being applied to the frame. The programmable controller may generate the one or more commands based on the current preload force obtained from the compression sensor.

In another form, the frame may include a free-moving connector that connects the frame to the driving mechanism.

In one instance, the free-moving connector may be a ball and socket connector that causes the frame to continuously articulate to equalize the preload force between the at least two compression interfaces.

In another instance, the free-moving connector may be located substantially at a center of the frame and has a first end secured in an opening of the compression sensor and a second end secured in an opening of the frame.

In yet another instance, the free-moving connector may be located outside a center of the frame to accommodate for an asymmetrical arrangement of the at least two compression interfaces.

According to one or more example embodiments, the frame may have a plurality of respective pivoting joints. The periphery portions of the frame may be attached, via the plurality of respective pivoting joints, to the at least two compression interfaces.

According to one or more example embodiments, the mounting assembly may include a fastener and a coupler. Each of the at least two compression interfaces may include a pusher configured to lock with the coupler and compress the mounting assembly. The pusher may be connected to the articulating joint of the frame at a periphery thereof. Each of the at least two compression interfaces may include a driver, nested inside the pusher, configured to install the fastener when the predetermined loading point is reached. The frame and the at least two compression interfaces may be removed after the thermal management device is secured, via the mounting assembly, to a printed circuit board.

Figure 10:
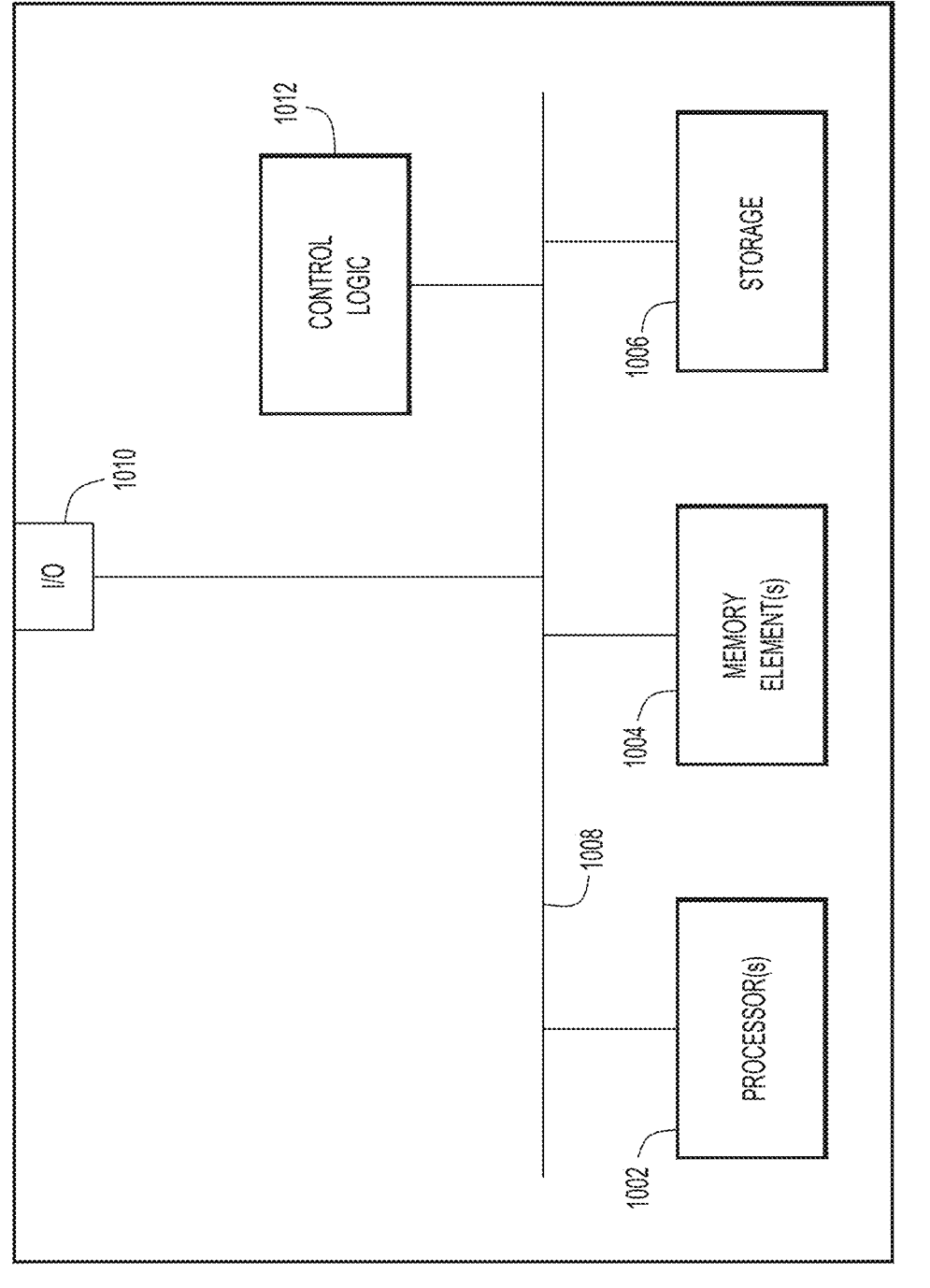
FIG. 10 is a hardware block diagram of a programmable controller that may perform functions associated with any combination of operations in connection with the techniques depicted and described in FIGS. 1-9, according to various example embodiments.

FIG. 10 is a hardware block diagram of a programmable controller 1000 that may perform functions associated with any combination of operations in connection with the techniques depicted in FIGS. 1-9, according to various example embodiments, including, but not limited to, operations of the programmable controller 340 of FIG. 3. It should be appreciated that FIG. 10 provides only an illustration of one example embodiment and does not imply any limitations with regard to the environments in which different example embodiments may be implemented. Many modifications to the depicted environment may be made.

In at least one embodiment, programmable controller 1000 may include one or more processor(s) 1002, one or more memory element(s) 1004, storage 1006, a bus 1008, one or more I/O interface(s) 1010, and control logic 1012. In various embodiments, instructions associated with logic for programmable controller 1000 can overlap in any manner and are not limited to the specific allocation of instructions and/or operations described herein.

In at least one embodiment, processor(s) 1002 is/are at least one hardware processor configured to execute various tasks, operations and/or functions for programmable controller 1000 as described herein according to software and/or instructions configured for programmable controller 1000. Processor(s) 1002 (e.g., a hardware processor) can execute any type of instructions associated with data to achieve the operations detailed herein. In one example, processor(s) 1002 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, one or more memory element(s) 1004 and/or storage 1006 is/are configured to store data, information, software, and/or instructions associated with programmable controller 1000, and/or logic configured for memory element(s) 1004 and/or storage 1006. For example, any logic described herein (e.g., control logic 1012) can, in various embodiments, be stored for programmable controller 1000 using any combination of memory element(s) 1004 and/or storage 1006. Note that in some embodiments, storage 1006 can be consolidated with one or more memory elements 1004 (or vice versa), or can overlap/exist in any other suitable manner. In one or more example embodiments, process data is also stored in the one or more memory elements 1004 for later evaluation and/or process optimization.

In at least one embodiment, bus 1008 can be configured as an interface that enables one or more elements of programmable controller 1000 to communicate in order to exchange information and/or data. Bus 1008 can be implemented with any architecture designed for passing control, data and/or information between processors, memory elements/storage, peripheral devices, and/or any other hardware and/or software components that may be configured for programmable controller 1000. In at least one embodiment, bus 1008 may be implemented as a fast kernel-hosted interconnect, potentially using shared memory between processes (e.g., logic), which can enable efficient communication paths between the processes.

I/O interface(s) 1010 allow for input and output of data and/or information with other entities that may be connected to programmable controller 1000. For example, I/O interface(s) 1010 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards.

In various embodiments, control logic 1012 can include instructions that, when executed, cause processor(s) 1002 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1012) may be identified based upon the application(s) for which they are implemented in a specific embodiment. However, it should be appreciated that any particular program nomenclature herein is used merely for convenience, and thus the embodiments herein should not be limited to use(s) solely described in any specific application(s) identified and/or implied by such nomenclature.

In various embodiments, entities as described herein may store data/information in any suitable volatile and/or nonvolatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, the storage 1006 and/or memory elements(s) 1004 can store data, software, code, instructions (e.g., processor instructions), logic, parameters, combinations thereof, and/or the like used for operations described herein. This includes the storage 1006 and/or memory elements(s) 1004 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

To the extent that embodiments presented herein relate to the storage of data, the embodiments may employ any number of any conventional or other databases, data stores or storage structures (e.g., files, databases, data structures, data, or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

In one example embodiment, one or more non-transitory computer readable storage media encoded with instructions are provided. When the media is executed by a programmable controller, the instructions cause the programmable controller to execute a method 900 in FIG. 9 and/or perform operations of the programmable controller 340 in FIG. 3.

In yet another example embodiment, a system, an apparatus, or an assembly is provided that includes the components and operations explained above with reference to FIGS. 1-10.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present embodiments to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure are described with more particular reference to the accompanying figures above.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A system comprising:
a programmable controller configured to generate one or more commands to control an installation of a thermal management device using a mounting assembly included on the thermal management device;
at least two compression interfaces, each for compressing the mounting assembly to a predetermined loading point;
a frame configured to apply a preload force to the at least two compression interfaces, wherein the frame has a pivoting joint at an assembly point for each of the at least two compression interfaces to balance the preload force between the at least two compression interfaces; and
a driving mechanism configured to drive the frame until the mounting assembly reaches the predetermined loading point, based on the one or more commands.

2. The system of claim 1, further comprising:
a compression sensor that measures a current preload force being applied to the frame,
wherein the programmable controller generates the one or more commands based on the current preload force obtained from the compression sensor.

3. The system of claim 2, wherein the frame includes a free-moving connector that connects the frame to the driving mechanism.

4. The system of claim 3, wherein the free-moving connector is a ball and socket connector that causes the frame to continuously articulate to equalize the preload force between the at least two compression interfaces.

5. The system of claim 4, wherein the free-moving connector is located substantially at a center of the frame and has a first end secured in an opening of the compression sensor and a second end secured in an opening of the frame.

6. The system of claim 4, wherein the free-moving connector is located outside a center of the frame to accommodate for an asymmetrical arrangement of the at least two compression interfaces.

7. The system of claim 1, wherein the frame has a plurality of respective pivoting joints and wherein periphery portions of the frame are attached, via the plurality of respective pivoting joints, to the at least two compression interfaces.

8. The system of claim 1, wherein the mounting assembly includes a fastener and a coupler and wherein each of the at least two compression interfaces includes:
a pusher configured to lock with the coupler and compress the mounting assembly, the pusher is connected to the pivoting joint of the frame at a periphery thereof, and
a driver, nested inside the pusher, configured to install the fastener when the predetermined loading point is reached,
wherein the frame and the at least two compression interfaces are removed after the thermal management device is secured, via the mounting assembly, to a printed circuit board.

9. A method comprising:
generating one or more commands by way of a programmable controller of a system to control an installation of a thermal management device using a mounting assembly included on the thermal management device, the programmable controller causing at least two compression interfaces of the system to compress the mounting assembly of the thermal management device to a predetermined loading point;
applying, using a frame of the system, a preload force to the at least two compression interfaces, wherein the frame has a pivoting joint at an assembly point for each of the at least two compression interfaces to balance the preload force between the at least two compression interfaces; and
driving, using a driving mechanism of the system and based on the one or more commands, the frame until the mounting assembly reaches the predetermined loading point.

10. The method of claim 9 further including:
measuring, using a compression sensor of the system, a current preload force being applied to the frame, wherein generating, using the programmable controller of the system, the one or more commands to control the installation of the thermal management device using the mounting assembly included on the thermal management device includes generating based on the current preload force obtained from the compression sensor.

11. The method of claim 9 wherein driving, using the driving mechanism of the system and based on the one or more commands, the frame until the mounting assembly reaches the predetermined loading point includes securing the thermal management device, via the mounting assembly, to a printed circuit board, the method further including:
removing the frame and the at least two compression interfaces after the thermal management device is secured, via the mounting assembly, to the printed circuit board.

12. A method comprising:
generating, using a programmable controller, one or more commands to control an installation of a thermal management device using a mounting assembly included on the thermal management device;
compressing, using at least two compression interfaces, the mounting assembly of the thermal management device to a predetermined loading point, wherein the at least two compression interfaces are caused to compress by the one or more commands generated using the programmable controller;
applying, using a frame, a preload force to the at least two compression interfaces, wherein the frame has a pivoting joint at an assembly point for each of the at least two compression interfaces to balance the preload force between the at least two compression interfaces; and
driving, using a driving mechanism and based on the one or more commands, the frame until the mounting assembly reaches the predetermined loading point.

13. The method of claim 12 further including:
measuring, using a compression sensor, a current preload force being applied to the frame, wherein generating, using the programmable controller, the one or more commands to control the installation of the thermal management device using the mounting assembly included on the thermal management device includes generating based on the current preload force obtained from the compression sensor.

14. The method of claim 12 wherein driving, using the driving mechanism and based on the one or more commands, the frame until the mounting assembly reaches the predetermined loading point includes securing the thermal management device, via the mounting assembly, to a printed circuit board, the method further including:

removing the frame and the at least two compression interfaces after the thermal management device is secured, via the mounting assembly, to the printed circuit board.

* * * * *